(12) United States Patent
Choi

(10) Patent No.: US 8,933,868 B2
(45) Date of Patent: Jan. 13, 2015

(54) ORGANIC LIGHT EMITTING DIODE DISPLAY AND METHOD FOR MANUFACTURING THE SAME

(75) Inventor: Woong-Sik Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 615 days.

(21) Appl. No.: 12/914,842

(22) Filed: Oct. 28, 2010

(65) Prior Publication Data

US 2011/0109532 A1 May 12, 2011

(30) Foreign Application Priority Data

Nov. 10, 2009 (KR) .................. 10-2009-0108266

(51) Int. Cl.
G09G 3/32 (2006.01)
H01L 27/32 (2006.01)

(52) U.S. Cl.
CPC ........ H01L 27/3269 (2013.01); H01L 27/3276 (2013.01)
USPC ............................................ 345/82; 313/498

(58) Field of Classification Search
USPC .............. 345/76–83, 204, 690; 313/483–512, 313/462
See application file for complete search history.

(56) References Cited

U.S. PATENT DOCUMENTS

| | | | |
|---|---|---|---|
| 2002/0093284 A1* | 7/2002 | Adachi et al. ................. | 313/506 |
| 2004/0195959 A1 | 10/2004 | Park et al. | |
| 2004/0263069 A1 | 12/2004 | Yamazaki et al. | |
| 2005/0116232 A1* | 6/2005 | Kim et al. ........................ | 257/72 |
| 2006/0060752 A1 | 3/2006 | Lee et al. | |
| 2007/0096647 A1* | 5/2007 | Choo et al. ..................... | 313/512 |
| 2007/0103063 A1* | 5/2007 | Kim ............................... | 313/504 |
| 2007/0108442 A1 | 5/2007 | Song et al. | |
| 2009/0001881 A1* | 1/2009 | Nakayama ..................... | 313/504 |

(Continued)

FOREIGN PATENT DOCUMENTS

| | | |
|---|---|---|
| EP | 2 219 223 A2 | 8/2010 |
| JP | 2006-190729 | 7/2006 |
| JP | 2007-140527 | 6/2007 |

(Continued)

OTHER PUBLICATIONS

European Search Report dated Aug. 5, 2011, for corresponding European Patent application 10190607.1, 8 pages.

(Continued)

Primary Examiner — Stephen Sherman
(74) Attorney, Agent, or Firm — Christie, Parker & Hale, LLP

(57) ABSTRACT

An organic light emitting diode (OLED) display and a method for manufacturing the same are described. An exemplary embodiment provides an OLED display including: a substrate including a plurality of pixel areas; a light emitting unit including an organic light emitting diode and a plurality of first thin film transistors, the light emitting unit being formed in each of the plurality of pixel areas; and a sensor unit including a photosensor and a plurality of second thin film transistors, the sensor unit being formed in at least some of the plurality of pixel areas. Each of the plurality of first thin film transistors and the plurality of second thin film transistors includes an oxide semiconductor layer, and the photosensor includes an oxide photoelectric conversion layer that are made of a same material on a same layer as the oxide semiconductor layer.

16 Claims, 8 Drawing Sheets

(56) References Cited

U.S. PATENT DOCUMENTS

| | | |
|---|---|---|
| 2009/0141004 A1 | 6/2009 | Yamazaki |
| 2009/0141224 A1 | 6/2009 | Ito et al. |

FOREIGN PATENT DOCUMENTS

| | | |
|---|---|---|
| JP | 2009-093154 A | 4/2009 |
| JP | 2009-134233 | 6/2009 |
| JP | 2009-146100 A | 7/2009 |
| JP | 2009-157367 | 7/2009 |
| JP | 2009-169400 A | 7/2009 |
| JP | 2009-244638 A | 10/2009 |
| KR | 10-2005-0115406 | 12/2005 |
| KR | 10-2008-0003125 A | 1/2008 |
| KR | 10-2008-0082277 | 9/2008 |
| KR | 10-2008-0101734 A | 11/2008 |
| KR | 10-2009-0057910 | 6/2009 |
| WO | WO 2009/081862 A1 | 7/2009 |

OTHER PUBLICATIONS

JPO Notice of Allowance dated Mar. 19, 213 for corresponding Application No. 2010-163179 (3 pages).

* cited by examiner

ORGANIC LIGHT EMITTING DIODE DISPLAY AND METHOD FOR MANUFACTURING THE SAME

CROSS-REFERENCE TO RELATED APPLICATIONS

This application claims priority to and the benefit of Korean Patent Application No. 10-2009-0108266 filed in the Korean Intellectual Property Office on Nov. 10, 2009, the entire content of which is incorporated herein by reference.

BACKGROUND

1. Field

Aspects of embodiments of the present invention relate to an organic light emitting diode (OLED) display.

2. Description of the Related Art

An OLED display is a self light emitting type display device that includes organic light emitting diodes for emitting light and displaying images. Since the OLED display does not require a separate light source, unlike a liquid crystal display (LCD), it has relatively reduced thickness and weight. In addition, since the OLED display has characteristics such as low power consumption, high luminance, high reaction speed, etc., it has gained interest as a next-generation display device for portable electronic devices.

A display device that can receive information through contacting a screen with a finger or a stylus pen has been developed. The display device having an information input function has been widely used for personal digital assistants (PDA), portable game machines, vehicle navigation, automated teller machines (ATM), etc.

The display device having the information input function has been manufactured by a method that couples a separately manufactured touch panel to a display panel or directly forms various sensors inside the display panel, and the like.

However, when a touch panel is manufactured separately, the overall thickness of the display device is increased, and the touch panel covers the display panel, thereby deteriorating the quality of images that are displayed on the display panel. On the other hand, when a sensor is formed directly inside the display panel, the structure becomes complicated and complexity of the manufacturing process is increased, such that productivity is deteriorated.

The above information disclosed in this Background section is only for enhancement of understanding of the background of the described technology, and therefore it may contain information that does not form the prior art that is already known to a person of ordinary skill in the art.

SUMMARY

Exemplary embodiments of the present invention provide an organic light emitting diode (OLED) display with a relatively simplified structure and improved performance while having an information display function and an input function.

In addition, the exemplary embodiments provide a relatively simplified manufacturing method of the above-mentioned organic light emitting diode (OLED) display.

An exemplary embodiment provides an OLED display including: a substrate including a plurality of pixel areas; a light emitting unit in each of the plurality of pixel areas, the light emitting unit including an organic light emitting diode and a plurality of first thin film transistors; and a sensor unit in each of at least some of the plurality of pixel areas, the sensor unit including a photosensor and a plurality of second thin film transistors. Each of the plurality of first thin film transistors and the plurality of second thin film transistors includes an oxide semiconductor layer, and the photosensor includes an oxide photoelectric conversion layer. The oxide semiconductor layer and the oxide photoelectric conversion layer include a same material on a same layer.

The oxide semiconductor layer and the oxide photoelectric conversion layer may include oxygen (O) and at least one element selected from the group consisting of gallium (Ga), indium (In), zinc (Zn), hafnium (Hf), and tin (Sn).

The substrate may include a transparent insulating material such that light emitted from the organic light emitting diode may be transmitted through the substrate.

The organic light emitting diode (OLED) display may further include a gate line, a data line, and a light emitting power line, each being electrically coupled to the plurality of first thin film transistors. Each of the plurality of first thin film transistors may include a gate electrode below the oxide semiconductor layer. The gate electrode may be made of a same material on a same layer as the gate line, the data line, and the light emitting power line.

The gate line may extend in a direction that crosses the data line and the light emitting power line. The gate line or both the data line and the light emitting power line may have disconnection units at crossings between the gate line and the data line and the light emitting power line. The disconnection units may be coupled to each other through a connection member formed on different layers.

The OLED display may further include a reset line, an output line, and a sensor power line that are electrically coupled to the plurality of second thin film transistors. Each of the plurality of second thin film transistors may include a gate electrode below the oxide semiconductor layer. The gate electrode may include a same material on a same layer as the reset line, the output line, and the sensor power line.

The gate electrode of each of the first thin film transistors and the gate electrode of each of the second thin film transistors may include a same material on a same layer.

The OLED display may further include a light emitting driver coupled to the light emitting unit and a sensor driver coupled to the sensor unit.

The OLED display may further include a light emitting controller for controlling the light emitting driver, a sensor controller for controlling the sensor driver, and a main controller coupled to the light emitting controller and the sensor controller.

The sensor controller may be configured to transfer a detection signal transferred from the sensor driver to the main controller, and the main controller may be configured to control the light emitting controller according to the detection signal to display images through the light emitting driver.

Another exemplary embodiment provides an organic light emitting diode (OLED) display including: a substrate; a gate electrode on the substrate; a gate insulating layer on the gate electrode; an oxide semiconductor layer overlapped with the gate electrode on the gate insulating layer; an oxide photoelectric conversion layer including a same material as the oxide semiconductor layer and located on the gate insulating layer; an interlayer insulating layer on the oxide semiconductor layer and the oxide photoelectric conversion layer; a source electrode and a drain electrode on the interlayer insulating layer and being in contact with the oxide semiconductor layer; and a pair of sensor electrodes on the interlayer insulating layer and being in contact with the oxide photoelectric conversion layer.

The oxide semiconductor layer may include oxygen (O) and at least one element of gallium (Ga), indium (In), zinc (Zn), hafnium (Hf), and tin (Sn).

The OLED display may further include a gate line, a data line, and a light emitting power line including a same material as and located on a same layer as the gate electrode.

The gate line may extend in a direction that crosses the data line and the light emitting power line. The gate line or both the data line and the light emitting power line may have disconnection units at the crossings between the gate line and the data line and the light emitting power line. The disconnection units may be coupled to each other through a connection member that includes a same material as the source electrode, the drain electrode, and the pair of sensor electrodes.

The source electrode may contact the data line or the light emitting power line.

The gate electrode may include a metallic material, and the source electrode, the drain electrode, and the pair of sensor electrodes may include a transparent conductive material.

The interlayer insulating layer may include a planarization layer.

The OLED display may further include an organic emission layer and a common electrode that are sequentially formed on a portion of the drain electrode.

Yet another exemplary embodiment provides a method for manufacturing organic light emitting diode (OLED) display, including: forming first conductive wires including a gate electrode, a gate line, a data line, and a light emitting power line on a substrate; forming a gate insulating layer on the first conductive wires; forming an oxide semiconductor pattern including an oxide semiconductor layer and an oxide photoelectric conversion layer on the gate insulating layer; forming an interlayer insulating layer on the oxide semiconductor pattern; forming a plurality of contact holes by etching the interlayer insulating layer or etching both the interlayer insulating layer and the gate insulating layer; and forming second conductive wires including a source electrode, a drain electrode, and a pair of sensor electrodes that contact the oxide semiconductor pattern or the first conductive wires through the plurality of contact holes.

The oxide semiconductor layer may include oxygen (O) and at least one element selected from the group consisting of gallium (Ga), indium (In), zinc (Zn), hafnium (Hf), and tin (Sn).

The source electrode may contact any one of the data line or the light emitting power line.

The gate line may extend in a direction crossing the data line and the light emitting power line. The gate line or both the data line and the light emitting power line may have disconnection units at crossings between the gate line and the data line and the light emitting power line.

The second conductive wires may further include a connection member, and the connection member may mutually couple to the disconnection units of the gate line, the data line, or the light emitting power line.

The method for manufacturing the OLED display may further include forming an organic light emitting diode by sequentially forming an organic emission layer and a common electrode on a portion of the drain electrode.

The first conductive wires may include a metallic material, and the second conductive wires may include a transparent conductive material.

According to the exemplary embodiments, the organic light emitting diode (OLED) display may have a relatively simplified structure and improved performance while having an information display function and an information input function.

In addition, the exemplary embodiments may simplify the method for manufacturing an organic light emitting diode (OLED) display.

DETAILED DESCRIPTION

Figure 1:
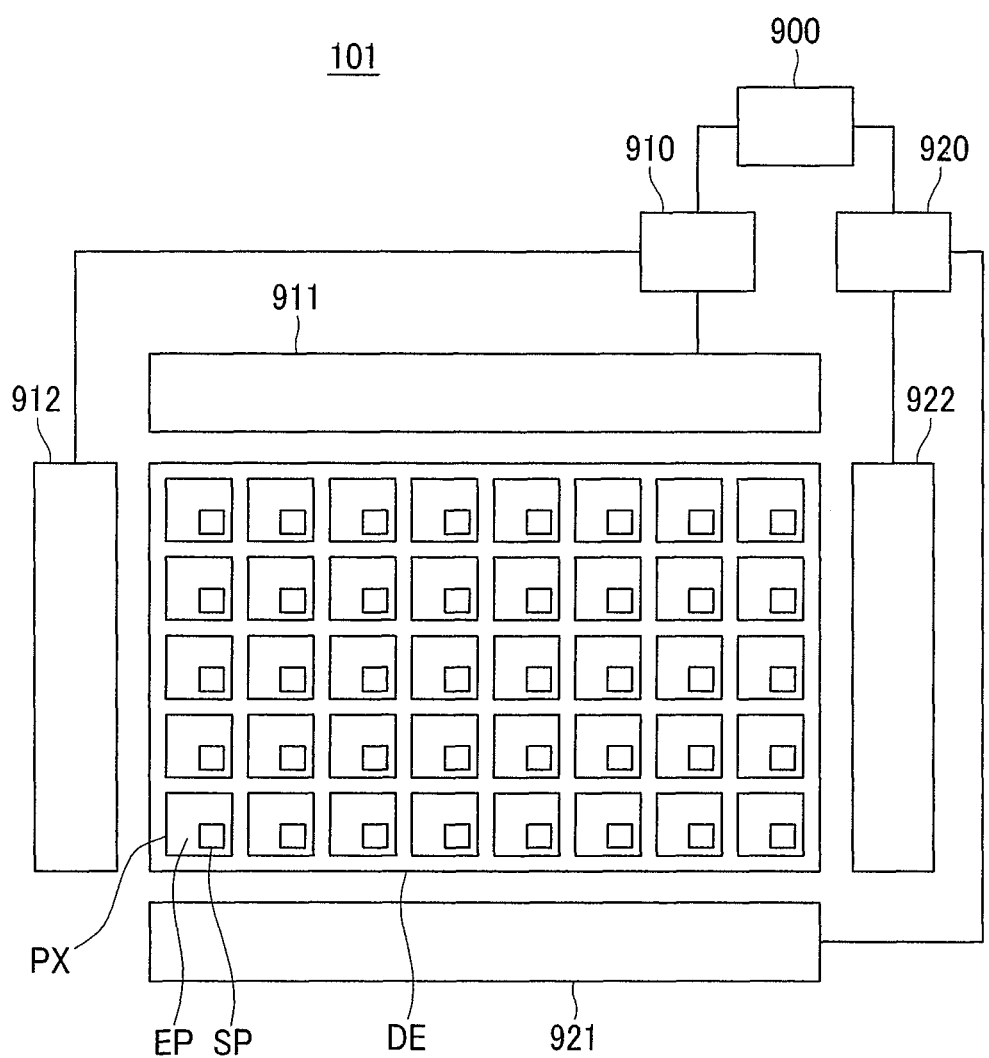
FIG. 1 is a block diagram showing a configuration of an organic light emitting diode (OLED) display according to an exemplary embodiment.

In the following detailed description, certain exemplary embodiments have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, the size and thickness of each component shown in the drawings are arbitrarily shown for understanding and ease of description, but the exemplary embodiments are not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it may be directly on the other element, or intervening elements may also be present.

Hereinafter, an exemplary embodiment will be described with reference to FIGS. 1 to 4.

As shown in FIG. 1, an organic light emitting diode (OLED) display 101 includes a plurality of pixel areas (PX) that are formed in a display area (DE). A light emitting unit (EP) is formed in each of the plurality of pixel areas (PX). In addition, a sensor unit (SP) is formed in at least some pixel areas (PX) among the plurality of pixel areas (PX). In other words, the light emitting unit (EP) is formed in all the pixel areas (PX), but the sensor unit (SP) may be formed in all the pixel areas (PX) or only in some pixel areas (PX).

In addition, the OLED display 101 further includes light emitting drivers 911 and 912 that are connected to the light emitting unit (EP), and sensor drivers 921 and 922 that are connected to the sensor unit (SP) and drive the sensor unit (SP). The light emitting drivers include a first light emitting driver 911 that supplies a data signal to the light emitting unit (EP) and a second light emitting driver 912 that supplies a gate signal to the light emitting unit (EP). The sensor drivers include a first sensor driver 921 that receives a detection signal from the sensor unit (SP) and a second sensor driver 922 that supplies a reset signal to the sensor unit (SP). The OLED display 101 further includes a light emitting controller 910 that controls the light emitting drivers 911 and 912, a sensor controller 920 that controls the sensor drivers 921 and 922, and a main controller 900 that is connected to the light emitting controller 910 and the sensor controller 920.

The light emitting controller 910 controls the first light emitting driver 911 and the second light emitting driver 912. The light emitting controller 910 includes an analog-to-digital (A-D) conversion circuit that converts analog image data into digital data, and an image processing circuit that performs image processing such as gamma correction, etc.

The sensor controller 920 controls the first sensor driver 921 and the second sensor driver 922. The sensor controller 920 analyzes the detection signal that is received from the first sensor driver 921.

The main controller 900 includes a central processing unit (CPU) that performs various arithmetic processes, an arithmetic circuit for image processing, a memory circuit, etc.

However, the exemplary embodiment is not limited to the foregoing. Therefore, the configurations and roles of each of the drivers 911, 912, 921, and 922 and the controllers 910, 920, and 900 can be variously modified in other exemplary embodiments by those skilled in the art.

An information input process and an information output process of the OLED display 101 according to the exemplary embodiment will be described in more detail. The sensor unit (SP) converts received light into an electrical signal and transmits it to the sensor drivers 921 and 922. The sensor controller 920 analyzes the detection signal that is received by the sensor drivers 921 and 922 to determine a selected position. The main controller 900 transmits an analog signal to the light emitting controller 910 based on information read by the sensor controller 920. The light emitting controller 910 converts the analog signal into a digital signal and transmits it to the light emitting drivers 911 and 912, and the light emitting drivers 911 and 912 transmit a video signal to each light emitting unit (EP). The light emitting units (EP) emit light according to the transmitted video signal to display images.

Figure 2:
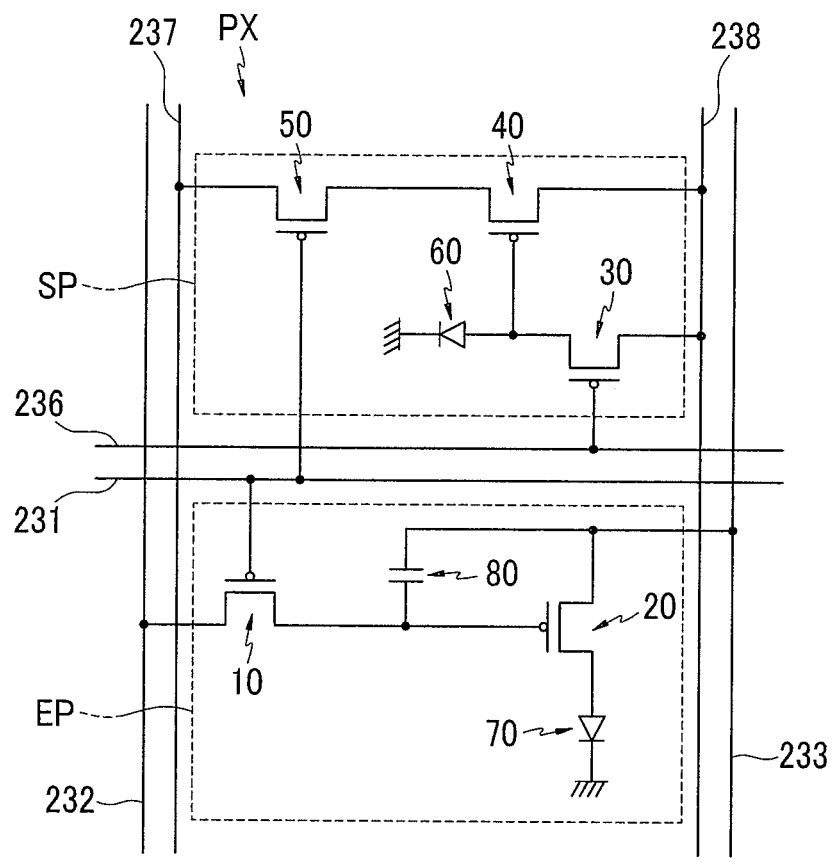
FIG. 2 is a circuit diagram of a light emitting unit and a sensor unit of a pixel area of FIG. 1.

As shown in FIG. 2, each light emitting unit (EP) includes an organic light emitting diode 70 and a plurality of thin film transistors (TFTs) 10 and 20 for controlling emission, and the sensor unit (SP) includes a photosensor 60 and a plurality of thin film transistors 30, 40, and 50.

In addition, the OLED display 101 includes a gate line 231, a data line 232, a light emitting power line 233, a sensor power line 238, a reset line 236, an output line 237, each of which is connected to at least one component of the light emitting unit (EP) and/or the sensor unit (SP). In one exemplary embodiment, each of the above-mentioned lines 231, 232, 233, 236, 237, and 238 is made of the same material on the same layer.

First, the light emitting unit (EP) will be described in more detail.

The light emitting unit (EP) has a 2Tr-1Cap structure that includes the organic light emitting diode 70, the first thin film transistor 10 for emission, the second thin film transistor 20 for emission, and a capacitor 80 for emission. However, the exemplary embodiment is not limited thereto. Therefore, the light emitting unit (EP) may include three or more thin film transistors for emission and two or more capacitors for emission. In one embodiment, the added thin film transistor for emission and capacitor for emission may be a component of a compensation circuit. The compensation circuit improves uniformity of the light emitting unit (EP) that is formed for each pixel (PX), thereby suppressing the occurrence of a deviation in the image quality. In some embodiments, the compensation circuit includes two to eight thin film transistors.

The organic light emitting diode 70 includes an anode electrode that is a hole injection electrode, a cathode electrode that is an electron injection electrode, and an organic emission layer that is disposed between the anode and cathode electrodes.

Each of the first thin film transistor 10 and the second thin film transistor 20 includes a gate electrode, an oxide semiconductor layer, a source electrode, and a drain electrode.

The first thin film transistor 10 is connected to the gate line 231 and the data line 232, and the second thin film transistor 20 is connected to the organic light emitting diode 70 and the light emitting power line 233.

The first thin film transistor 10 is used as a switch that selects the light emitting unit (EP) to be light-emitted. The gate electrode of the first thin film transistor 10 is connected to the gate line 231, and the source electrode of the first thin film transistor 10 is connected to the data line 232. The first thin film transistor 10 transmits a data voltage input from the data line 232 to the second thin film transistor 20 according to the switching voltage applied to the gate line 231.

The capacitor 80 is connected to the drain electrode of the first thin film transistor 10 and the light emitting power line 233, and stores a voltage corresponding to a voltage difference between a voltage that is transferred from the thin film transistor 10 and a voltage that is supplied to the light emitting power line 233.

The second thin film transistor 20 supplies driving power to the organic light emitting diode 70 to emit light in the selected light emitting unit (EP). The gate electrode of the second thin film transistor 20 is connected to a terminal of the capacitor 80 that is connected to the drain electrode of the first thin film transistor 10. The source electrode of the second thin film transistor 20 and the other terminal of the capacitor 80 are connected to the light emitting power line 233.

In addition, a part of the drain electrode of the second thin film transistor 20 becomes the anode of the organic light emitting diode 70.

As described above, the second thin film transistor 20 is connected to the light emitting power line 233 and the capacitor 80, and supplies an output current ($I_{OLED}$), which is proportional to a square of the difference between a voltage stored in the capacitor 80 and a threshold voltage of the second thin film transistor 20, to the organic light emitting diode 70. The organic light emitting diode 70 light-emits corresponding to the output current ($I_{OLED}$) that is supplied from the second thin film transistor 20.

Next, the sensor unit (SP) will be described in more detail.

The sensor unit (SP) includes the photosensor 60, the third thin film transistor 30, the fourth thin film transistor 40, and a fifth thin film transistor 50. However, the exemplary embodiment is not limited thereto. Therefore, the sensor unit (SP) may have two or more thin film transistors or four or more thin film transistors.

The photosensor 60 has an oxide photoelectric conversion layer and a pair of sensor electrodes. Each of the third thin film transistor 30, the fourth thin film transistor 40, and the fifth thin film transistor 50 includes a gate electrode, an oxide semiconductor layer, a source electrode, and a drain electrode. Here, the oxide semiconductor layer and the oxide photoelectric conversion layer are made of the same material on the same layer.

The gate electrode of the third thin film transistor 30 is connected to the reset line 236, the source electrode of the third thin film transistor 30 is connected to the sensor power line 238, and the drain electrode of the third thin film transistor 30 is connected to the gate electrode of the fourth thin film transistor 40 and the photosensor 60. In addition, the drain electrode of the fourth thin film transistor 40 is connected to the sensor power line 238.

The gate electrode of the fifth thin film transistor 50 is connected to the gate line 231. The source electrode of the fifth thin film transistor 50 is connected to the source electrode of the fourth thin film transistor 40, and the drain electrode of the fifth thin film transistor 50 is connected to the output line 237. Here, the polarities of the third thin film transistor 30 and the fourth thin film transistor 40 are formed to be different from each other.

First, the third thin film transistor 30 connected to the reset line 236 is selected and turned on by the signal of the reset line 236. At this time, the potential (or voltage) of the sensor power line 238 is supplied to the gate electrode of the fourth thin film transistor 40 through the third thin film transistor 30. Therefore, a reverse bias voltage is applied between the sensor electrodes of the photosensor 60.

At this time, the source electrode of the fourth thin film transistor 40 is maintained at a potential that is a difference between the potential difference between the source electrode and the gate electrode of the fourth thin film transistor 40 and the potential of the sensor power supply line 238. At this time, the fifth thin film transistor 50, which is connected to the gate line 231, is turned off. A period when the third thin film transistor 30 is turned on by the signal of the reset signal 236 as described above is referred to as a reset period.

Next, when the potential of the reset line 236 is changed, the third thin film transistor 30 connected to the corresponding reset line 236 is turned off, and another reset line is selected to transmit the signal. When the potential of the reset line 236 is changed such that the reset line is in the non-selection state and light is irradiated to the photosensor 60 corresponding to the corresponding reset line 236, current flows between the sensor electrodes of the photosensor 60. At this time, the reverse bias voltage between the sensor electrodes of the photosensor 60 that is applied during the reset period is lowered.

Next, the fifth thin film transistor 50 is turned on by a signal applied to the gate line 231. A period when the reset line 236 is not selected and the fifth thin film transistor 50 is turned on is referred to as an extraction period. As time elapses during the extraction period, the reverse bias voltage between the sensor electrodes of the photosensor 60 is small, wherein the variation of the reverse bias voltage is proportional to intensity of light that is irradiated onto the oxide photoelectric conversion layer of the photosensor 60. At this time, the potential of any one of the pair of sensor electrodes of the photosensor 60 is maintained to be constant. Therefore, the potential of the sensor electrode, which is connected to the gate electrode of the fourth thin film transistor 40 among the sensor electrodes of the photosensor 60, is lowered. Therefore, the gate electrode of the fourth thin film transistor 40 is deteriorated.

Since the source electrode of the fourth thin film transistor 40 is connected to a constant current power supply, the fourth thin film transistor 40 functions as a source follower. In other words, the voltage between the gate and source electrodes of the fourth thin film transistor 40 is always maintained to be constant. Therefore, as the potential between the sensor electrodes of the photosensor 60 is changed, the potential of the gate electrode of the fourth thin film transistor 40 is changed, and the potential of the source electrode is changed accordingly. When the extraction period elapses and the gate line 231 is selected, the change in the potential of the source electrode of the fourth thin film transistor 40 is output to the output line 237 while the fifth thin film transistor 50 for a sensor is turned on. As described above, the amount of light received by the photosensor 60 of the sensor unit (EP) is detected, such that it can be read as a voltage signal.

As described above, the configuration of the light emitting unit (EP) and the sensor unit (SP) is not limited to the foregoing, and therefore can be variously modified by those skilled in the art.

In the above-mentioned configuration, the OLED display 101 includes the light emitting unit (EP) and the sensor unit (SP), making it possible to simultaneously or concurrently perform the display and input of information. Further, the OLED display 101 has improved performance while having a relatively simple structure.

Figure 3:
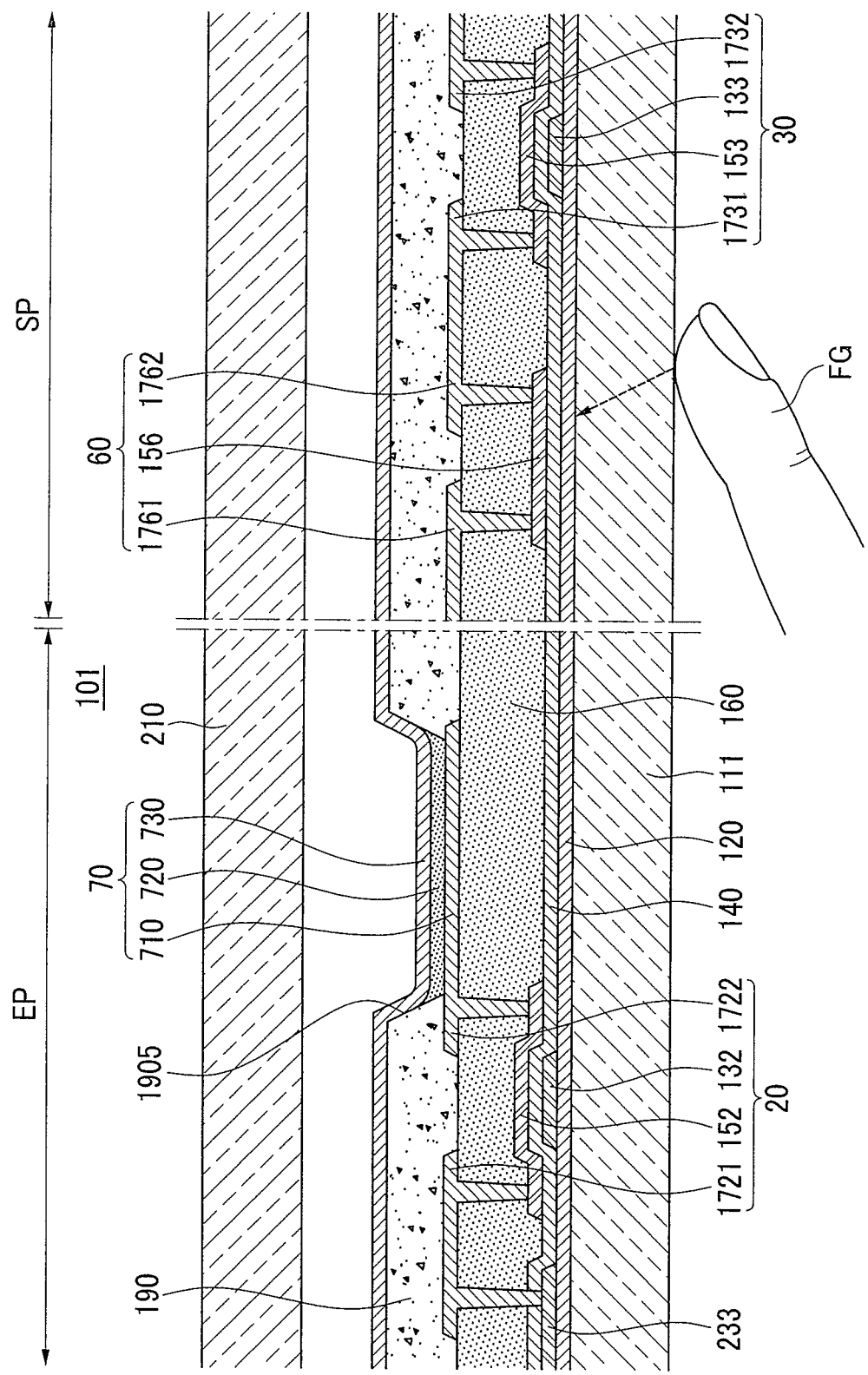
FIG. 3 is an enlarged cross-sectional view showing a part of a pixel area of the OLED display of FIG. 1.

Hereinafter, the stacking structure of the OLED display 101 will be described in detail with reference to FIG. 3. FIG. 3 shows a cross-sectional view of a structure of the light emitting unit (EP) and the sensor unit (SP), which are formed in the pixel area (PX) on a substrate main body 111, including the second thin film transistor 20, the organic light emitting diode 70, the photosensor 60, and the third thin film transistor 30.

As shown in FIG. 3, the substrate main body 111 may be formed of an insulating substrate that is made of glass, quartz, ceramic, plastic, etc. In addition, the substrate main body 111 is transparent to transmit light. However, the exemplary embodiment is not limited thereto.

A buffer layer 120 is formed on the substrate main body 111. The buffer layer 120 may be formed of any one of various suitable inorganic layers and organic layers. The buffer layer 120 is provided for planarizing a surface while preventing infiltration of undesirable components such as impurity elements or moisture. However, the buffer layer 120 may be omitted according to the type and conditions of the substrate main body 111.

First conductive wires, which include gate electrodes 132 and 133 of the thin film transistors 20 and 30, respectively, and the light emitting power line 233, are formed on the buffer layer 120. Although not shown in FIG. 3, the first conductive wires further include the gate line 231, the data line 232, the sensor power line 238, the reset line 236, and the output line 237.

As described above, the gate electrodes 132 and 133, the gate line 231, the data line 232, the light emitting power line 233, the sensor power line 238, the reset line 236, and the output line 237 are formed by the same process, making it possible to simplify the manufacturing process of the OLED display 101.

Here, the gate line 231 is formed in a direction that crosses the data line 232 and the light emitting power line 233. However, since the gate line 231 is electrically isolated from the data line 232 and the light emitting power line 233, the gate line 231 or the data line 232 and the light emitting power line 233 have a disconnection part that is broken at the crossing area.

Figure 4:
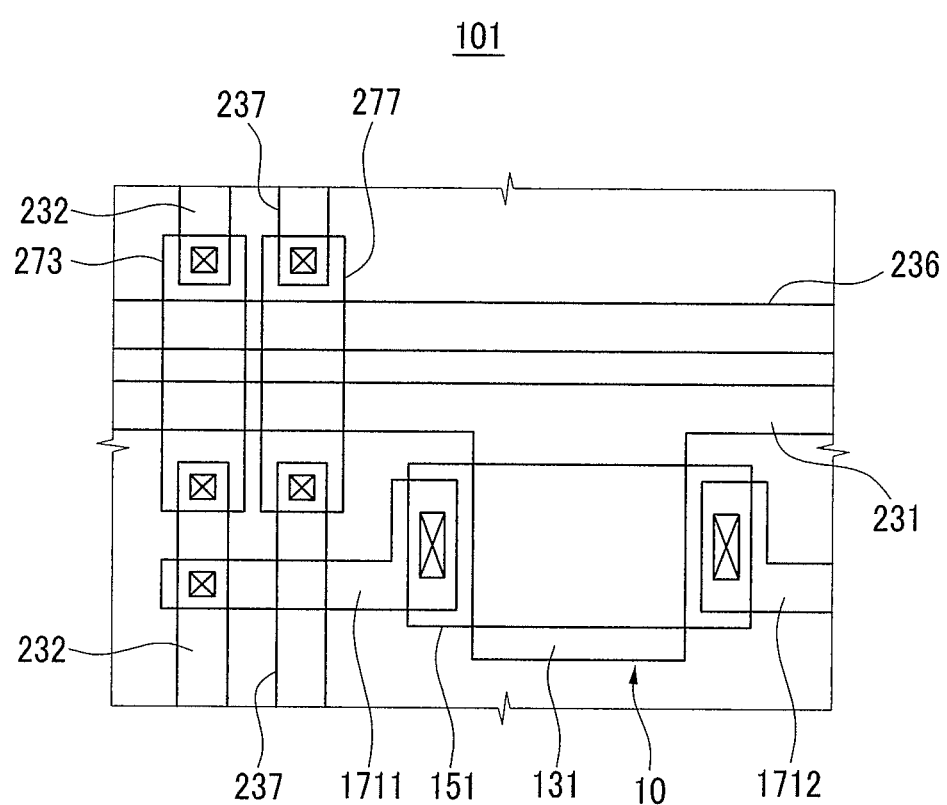
FIG. 4 is an enlarged layout view showing a crossing area of a gate line and a data line at the pixel area of the OLED display of FIG. 1.

For example, as shown in FIG. 4, a part of the data line 232 can be disconnected, putting the gate line 231 therebetween. Although not shown in FIG. 4, the light emitting power line 233 may have a disconnected structure, like the data line 232. However, the exemplary embodiment is not limited thereto. Therefore, in some embodiments, the gate line 231 may have the above described disconnected structure. The disconnection parts are connected to each other through a connection member 273 that is formed on other layers. The connection member 273 is made of the same material as source electrodes 1711, 1721, and 1731, drain electrodes 1712, 1722, and 1732, and a pair of sensor electrodes 1761 and 1762 on the same layer.

In addition, the reset line 236 or the output line 237 and the sensor power line 238 may be disconnected at the crossing areas, like the gate line 231 or the data line 232 and light emitting power line 233, and may be connected through other connection members 277.

Referring back to FIG. 3, the first conductive wires 132, 133, and 233 may be made of a metal layer. The metal layer used for the first conductive wires 132, 133, and 233 may be made of a metal such as Al, Ag, Cr, Ti, Ta, Mo, etc., and an alloy thereof. The first conductive wires 132, 133, and 233 may be formed of a single layer or may be formed of a metal layer including Cr, Mo, Ti, or Ta having excellent physical and chemical characteristics, or an alloy thereof, and a metal layer of an Al group or a Ag group having suitable resistance.

A gate insulating layer 140, which may be made of tetraethyl orthosilicate (TEOS), silicon nitride (SiNx), silicon oxide ($SiO_2$), etc., is formed on the first conductive wires 132, 133, and 233. However, the material of the gate insulating layer 140 is not limited to the foregoing.

An oxide semiconductor pattern, which includes oxide semiconductor layers 152 and 153 of the thin film transistors 20 and 30, respectively, and an oxide photoelectric conversion layer 156, is formed on the gate insulating layer 140. In other words, the oxide semiconductor layers 152 and 153 and the oxide photoelectric conversion layer 156 are made of the same material on the same layer.

In addition, the oxide semiconductor layers 152 and 153 are formed to be overlapped with the gate electrodes 132 and 133, respectively. In other words, the respective gate electrodes 132 and 133 of the thin film transistors 20 and 30 are respectively disposed below the oxide semiconductor layers 152 and 153. As described above, when the gate electrodes 132 and 133 are disposed below the oxide semiconductor layers 152 and 153, respectively, the size of the thin film transistors 20 and 30 may be formed to be relatively small. Therefore, the overall space utilization of the OLED display 101 may be increased. In other words, the integration of the OLED display 101 may be improved.

The oxide semiconductor patterns 152, 153, and 156 may be made of an oxide including at least one element of gallium (Ga), indium (In), zinc (Zn), and tin (Sn), as well as oxygen (O). For example, the oxide semiconductor patterns 152, 153, and 156 may be an oxide such as InZnO, InGaO, InSnO, ZnSnO, GaSnO, GaZnO, HfInZnO, GaInZnO, etc.

The thin film transistors 20 and 30 using the oxide semiconductor layers 152 and 153, respectively, have effective mobility that is 2 to 100 times that of a thin film transistor using hydrogenated amorphous silicon, and an on/off current ratio having a value of $10^5$ to $10^8$. In other words, the thin film transistors 20 and 30 having the oxide semiconductor layers 152 and 153, respectively, have relatively excellent semiconductor characteristics. In addition, in the above described oxide semiconductor layers 152 and 153, the band gap is about 3.0 to 3.5 eV, such that a light leakage current due to visible light does not occur. Therefore, the OLED display may suppress the occurrence of an instant afterimage. In addition, in order to improve the characteristics of the thin film transistors 20 and 30, group III, group IV, group V, or transition elements of the periodic table may be added to the oxide semiconductor layers 152 and 153. Further, in the case of using the oxide semiconductor layers 152 and 153, the thin film transistors 20 and 30 with relatively high mobility or large current flow may be manufactured.

In addition, the organic light emitting diode 70, which is connected to the thin film transistor 20 using the oxide semiconductor layer 152, may suppress the deviation of luminance as compared to an organic light emitting diode using polysilicon.

Moreover, the use of the oxide photoelectric conversion layer 156 considerably suppresses the deviation of characteristics of the photosensor as compared to using a photoelectric conversion layer made of polysilicon, such that a touch position may be detected with high precision by the photosensor 60.

As described above, the OLED display 101 using the oxide semiconductor layers 152 and 153 and the oxide photoelectric conversion layer 156 may have an information display function and an information input function with high reliability.

An interlayer insulating layer 160 is formed on the oxide semiconductor patterns 152, 153, and 156. The interlayer insulating layer 160 may be made of various suitable organic materials or inorganic materials that are known to those skilled in the art. Further, the interlayer insulating layer 160 may include a planarization layer having planarization characteristics, or may be formed as a planarization layer.

Figure 7:
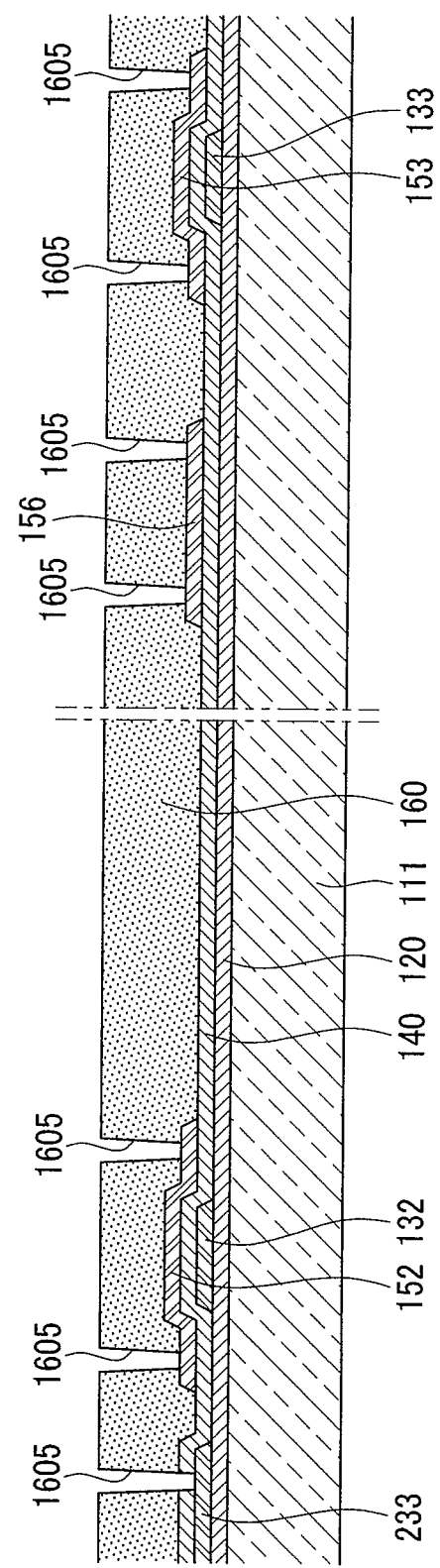

Further, the interlayer insulating layer 160 is etched, or the interlayer insulating layer 160 and the gate insulating layer 140 are etched together to form a plurality of contact holes 1605 (shown in FIG. 7) that expose the oxide semiconductor layers 152 and 153 and a part of the oxide conversion layer 156 or parts of the first conductive wires 132, 133, and 233. The contact holes 1605 are illustrated in FIG. 7.

The second conductive wires that include source electrodes 1721 and 1731, drain electrodes 1722 and 1732, and a pair of sensor electrodes 1761 and 1762, are formed on the interlayer insulating layer 160. The second conductive wires further include the connection members 273 and 277 (shown in FIG. 4).

As shown in FIG. 3, the source electrode 1721 of the second thin film transistor 20 contacts the light emitting power line 233 through a contact hole. Further, as shown in FIG. 4, the source electrode 1711 of the first thin film transistor 10 may contact the data line 232 through a contact hole. In addition, referring back to FIG. 3, a part of the drain electrode 1722 of the second thin film transistor 20 becomes a pixel electrode 710 of the organic light emitting diode 70, which is an anode. In addition, each of the pair of sensor electrodes 1761 and 1762 contact the oxide photoelectric conversion layer 156 through the contact hole.

The second conductive wires 1721, 1722, 1731, 1732, 1761, and 1762 may be made of a transparent conducting material. The transparent conductive material may include indium tin oxide (ITO), indium zinc oxide (IZO), zinc oxide (ZnO), indium oxide ($In_2O_3$), etc.

An organic emission layer 720 and a common electrode 730 are sequentially formed on a part of the drain electrode 1722 of the second thin film transistor 20, which is the pixel electrode 710. The common electrode 730 becomes a cathode of the organic light emitting diode 70. However, the above described exemplary embodiment is not limited to the foregoing. Therefore, the pixel electrode 710 may be a cathode and the common electrode 730 may be an anode.

In addition, the OLED display 101 further includes a pixel defining layer 190. The pixel defining layer 190 has an opening 1905. The opening 1905 of the pixel defining layer 1905 exposes a part of the drain electrode 1722 of the second thin film transistor 20 or the pixel electrode 710. As described above, the opening 1905 of the pixel defining layer 190 defines an area where the organic emission layer 720 is light-emitted in the light emitting unit (EP). In other words, the organic emission layer 720 formed within the opening 1905 of the pixel defining layer 190 emits light to display images. Light generated from the organic light emitting diode 70 can display images while the light is transmitted to the outside through the substrate main body 111.

Further, the OLED display 101 may further include a sealing member 210 that is placed on the substrate main body 111 and sealed together to protect the organic emission layer 720. A space between the sealing member 210 and the substrate main body 111 may be sealed with a sealant. The sealing member 210 may be formed as an insulating substrate that is made of glass, quartz, ceramic, plastic, etc., or a metallic substrate that is made of a stainless steel, etc.

In addition, the sealing member 210 may be formed as a sealing thin film that is formed of at least one organic layer or inorganic layer or is stacked with at least one inorganic layer and at least one organic layer together.

With the above-mentioned configuration, the OLED display 101 according to the above-described exemplary embodiment may have a relatively simple structure while having the information display function and the information input function. Further, the OLED display 101 including the thin film transistors 10, 20, 30, 40, and 50 and the photosensor 60 may have improved performance and relatively excellent characteristics.

In FIG. 3, reference numeral FG indicates a user's finger. An arrow shown by a dotted line indicates a path through which the photosensor 60 detects the position of the finger FG.

Hereinafter, with regard to FIGS. 5 to 8, a method for manufacturing the OLED display 101 according to one exemplary embodiment will be described.

Figure 5:
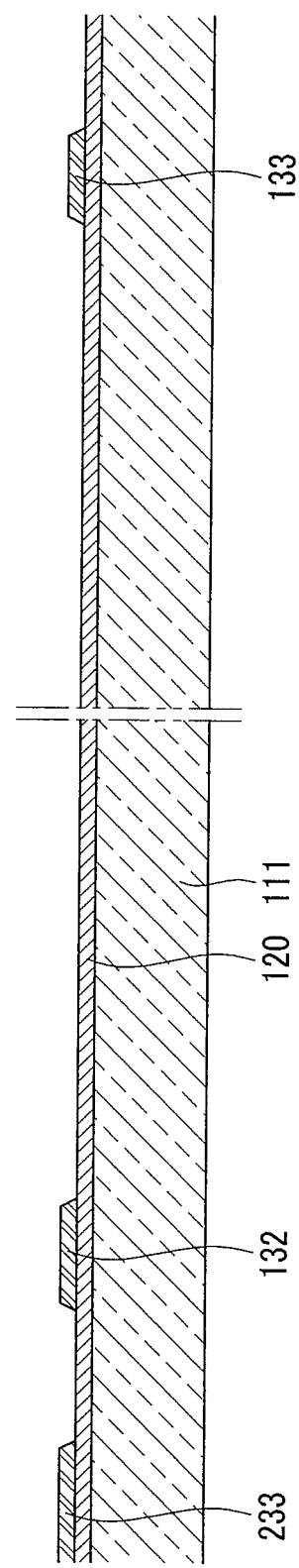
FIGS. 5, 6, 7, and 8 are cross-sectional views sequentially showing a process for manufacturing an OLED display according to an exemplary embodiment.

First, as shown in FIG. 5, the buffer layer 120 is formed on the substrate main body 101. The first conductive wires 132, 133, and 233 are formed on the buffer layer 120. The first conductive wires include the gate electrodes 132 and 133 and the light emitting power line 233. In addition, although not shown in FIG. 5, the first conductive wires may further include the gate line 231, the data line 232, the reset line 236, the output line 237, the sensor power line 238, etc. In FIG. 5, the first conductive wires 132, 133, and 233 are formed of the same metal layer.

Figure 6:
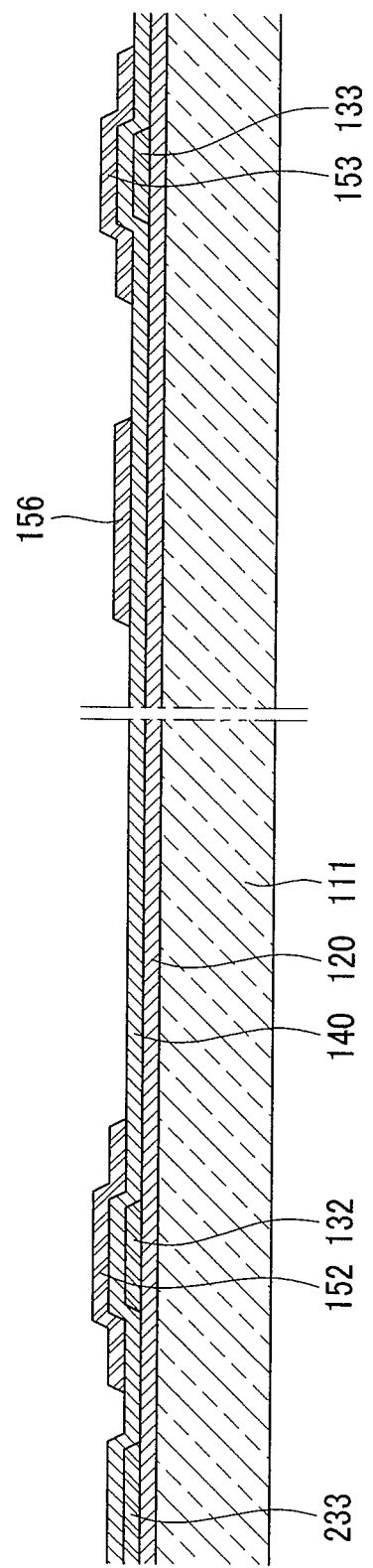

Next, as shown in FIG. 6, the gate insulating layer 140, which covers the first conductive wires 132, 133, and 233, is formed. The oxide semiconductor pattern, which includes the oxide semiconductor layers 152 and 153 and the oxide photoelectric conversion layer 156, is formed on the gate insulating layer 140.

In one embodiment, the oxide semiconductor patterns 152, 153, and 156 are made of an oxide including at least one element of gallium (Ga), indium (In), zinc (Zn), and tin (Sn), as well as oxygen (O).

Next, as shown in FIG. 7, the interlayer insulating layer 160, which covers the oxide semiconductor patterns 152, 153, and 156, is formed. The interlayer insulating layer 160 is etched or the interlayer insulating layer 160 and the gate insulating layer 140 are etched together to form a plurality of contact holes 1605 that expose the oxide semiconductor layers 152 and 153 and a part of the oxide conversion layer 156 or a part of the first conductive wires 132, 133, and 233.

Figure 8:
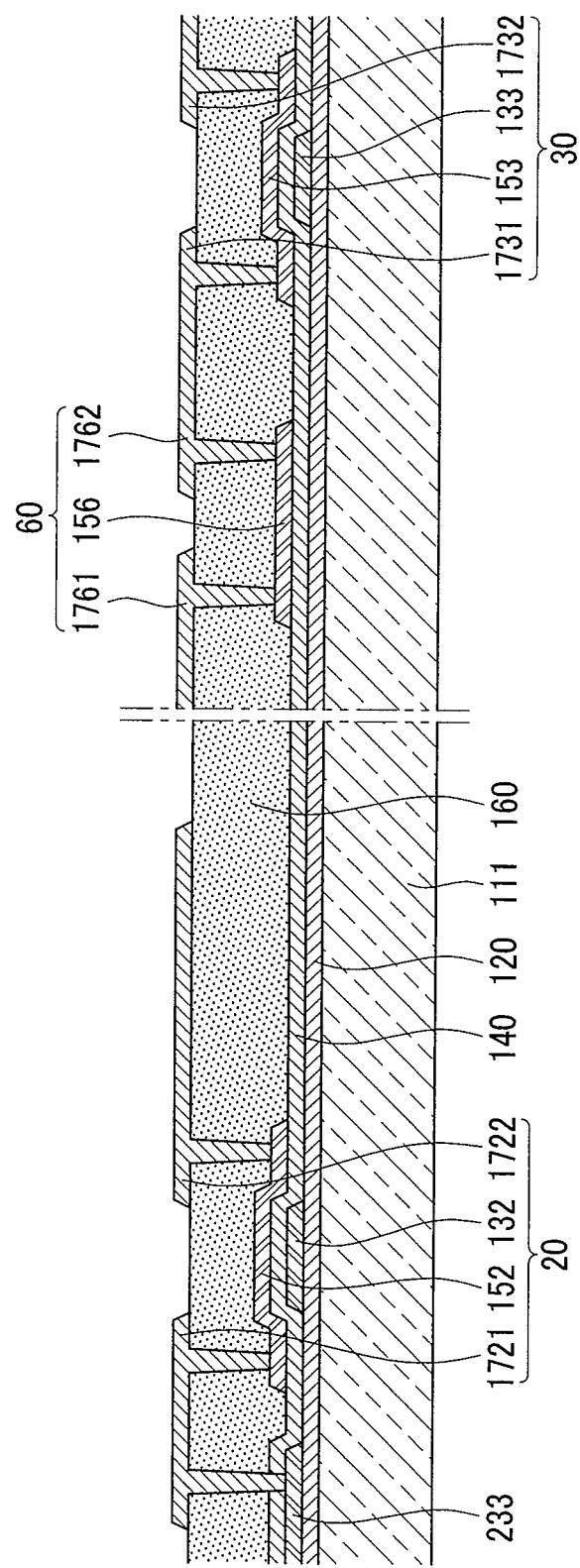

Next, as shown in FIG. 8, the second conductive wires, which include the source electrodes 1721 and 1731, the drain electrodes 1722 and 1732, and the pair of sensor electrodes 1761 and 1762, are formed on the interlayer insulating layer 160. Although not shown in FIG. 8, the second conductive wires may further include the connection members 273 and 277 (shown in FIG. 4). Moreover, a part of the drain electrode 1722 of the second thin film transistor 20 becomes the pixel electrode 710 of the organic light emitting diode 70.

Next, as shown in FIG. 3, the pixel defining layer 190, the organic emission layer 720, and the common electrode 730 are formed. The OLED display 101 according to one exemplary embodiment is formed by placing the sealing member 210 on the substrate main body 111, which are sealed together.

The above-mentioned manufacturing method may relatively simplify the manufacturing of the OLED display 101 according to the above described exemplary embodiment.

While this disclosure has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims and their equivalents.

What is claimed is:

1. An organic light emitting diode display comprising:
    a substrate comprising a plurality of pixel areas;
    a light emitting unit in each of the plurality of pixel areas, the light emitting unit comprising an organic light emitting diode and a plurality of first thin film transistors;
    a gate line, a data line, and a light emitting power line each electrically coupled to the plurality of first thin film transistors; and
    a sensor unit in each of at least some of the plurality of pixel areas, the sensor unit comprising a photosensor and a plurality of second thin film transistors,
    wherein each of the plurality of first thin film transistors and the plurality of second thin film transistors comprises an oxide semiconductor layer and a gate electrode between the oxide semiconductor layer and the substrate, and the photosensor comprises an oxide photoelectric conversion layer, the oxide semiconductor layer and the oxide photoelectric conversion layer comprising a same material on a same layer, wherein the gate line, the data line, and the light emitting power line comprise a same material as and are on a same layer as the gate electrodes of the first thin film transistors.

2. The organic light emitting diode display of claim 1, wherein
    the oxide semiconductor layer and the oxide photoelectric conversion layer comprise oxygen (O) and at least one element selected from the group consisting of gallium (Ga), indium (In), zinc (Zn), hafnium (Hf), and tin (Sn).

3. The organic light emitting diode display of claim 1, wherein the substrate comprises a transparent insulating material such that light emitted from the organic light emitting diode is transmitted through the substrate.

4. The organic light emitting diode display of claim 1, wherein
    the gate line extends in a direction that crosses the data line and the light emitting power line,
    the gate line or both the data line and the light emitting power line have disconnection units at crossings between the gate line and the data line and the light emitting power line, and
    the disconnection units are coupled to each other through a connection member formed on different layers.

5. The organic light emitting diode display of claim 1, further comprising
    a reset line, an output line, and a sensor power line that are electrically coupled to the plurality of second thin film transistors,
    wherein the gate electrode comprises a same material on a same layer as the reset line, the output line, and the sensor power line.

6. The organic light emitting diode display of claim 5, wherein
the gate electrode of each of the first thin film transistors and the gate electrode of each of the second thin film transistors comprise a same material on a same layer.

7. The organic light emitting diode display of claim 1, further comprising
a light emitting driver coupled to the light emitting unit and a sensor driver coupled to the sensor unit.

8. The organic light emitting diode display of claim 7, further comprising
a light emitting controller for controlling the light emitting driver, a sensor controller for controlling the sensor driver, and a main controller coupled to the light emitting controller and the sensor controller.

9. The organic light emitting diode display of claim 8, wherein
the sensor controller is configured to transfer a detection signal that is transferred from the sensor driver to the main controller, and
the main controller is configured to control the light emitting controller according to the detection signal to display images through the light emitting driver.

10. An organic light emitting diode display comprising:
a substrate;
a gate electrode on the substrate;
a gate insulating layer on the gate electrode;
an oxide semiconductor layer overlapped with the gate electrode on the gate insulating layer, wherein the gate electrode is between the oxide semiconductor layer and the substrate;
a gate line, a data line, and a light emitting power line comprising a same material as and located on a same layer as the gate electrode;
an oxide photoelectric conversion layer comprising a same material as the oxide semiconductor layer and located on the gate insulating layer;
an interlayer insulating layer on the oxide semiconductor layer and the oxide photoelectric conversion layer;
a source electrode and a drain electrode on the interlayer insulating layer and being in contact with the oxide semiconductor layer; and
a pair of sensor electrodes on the interlayer insulating layer and being in contact with the oxide photoelectric conversion layer.

11. The organic light emitting diode display of claim 10, wherein
the oxide semiconductor layer and the oxide photoelectric conversion layer comprise oxygen (O) and at least one element selected from the group consisting of gallium (Ga), indium (In), zinc (Zn), hafnium (Hf), and tin (Sn).

12. The organic light emitting diode display of claim 10, wherein
the gate line extends in a direction that crosses the data line and the light emitting power line,
the gate line or both the data line and the light emitting power line have disconnection unit at crossings between the gate line and the data line and the light emitting power line, and
the disconnection units are coupled to each other through a connection member that comprises a same material as the source electrode, the drain electrode, and the pair of sensor electrodes.

13. The organic light emitting diode display of claim 10, wherein
the source electrode contacts the data line or the light emitting power line.

14. The organic light emitting diode display of claim 10, wherein the gate electrode comprises a metallic material, and
the source electrode, the drain electrode, and the pair of sensor electrodes comprise a transparent conductive material.

15. The organic light emitting diode display of claim 10, wherein the interlayer insulating layer comprises a planarization layer.

16. The organic light emitting diode display of claim 10, further comprising:
an organic emission layer and a common electrode that are sequentially formed on a portion of the drain electrode.

* * * * *